United States Patent [19]

Weimer

[11] 4,206,371
[45] Jun. 3, 1980

[54] CCD WITH DIFFERENTLY DOPED SUBSTRATE REGIONS BENEATH A COMMON ELECTRODE

[75] Inventor: Paul K. Weimer, Princeton, N.J.
[73] Assignee: RCA Corporation, New York, N.Y.
[21] Appl. No.: 955,187
[22] Filed: Oct. 27, 1978
[51] Int. Cl.[2] .................. G11C 19/78; H01L 29/78; H01L 27/14; H01L 31/00
[52] U.S. Cl. ............................. 307/221 D; 357/24; 357/30; 357/59; 357/89
[58] Field of Search ................ 357/24, 30; 307/221 D

[56] References Cited

U.S. PATENT DOCUMENTS

| 3,958,210 | 5/1976 | Levine | 357/24 |
| 3,967,254 | 6/1976 | Kosonocky et al. | 357/24 |
| 3,971,003 | 7/1976 | Kosonocky | 357/24 |
| 3,983,573 | 9/1976 | Ishihara | 357/24 |
| 4,060,738 | 11/1977 | Tasch et al. | 357/24 |

OTHER PUBLICATIONS

Lancaster et al., "A Recirculating CCD with Novel Input and Output Structures" IEE Int. Electron Devices Meeting (12/74) Tech. Digest pp. 108-111.

Primary Examiner—Gene M. Munson
Attorney, Agent, or Firm—H. Christoffersen; Samuel Cohen

[57] ABSTRACT

A CCD structure which includes beneath a single electrode, in response to a voltage applied to that electrode, a first substrate region in which a potential barrier is formed, a second substrate region on one side of the first region in which a relatively shallow potential well is formed, and a third substrate region on the other side of the first region in which a deeper potential well is formed. This kind of structure is useful, for example, in obtaining multiplexed outputs from a CCD array.

4 Claims, 15 Drawing Figures

LEGEND:—
$V_3 > V_2 > V_1$
$P^+ > P$
$N^- > N^{--} > N^{---}$

CCD WITH DIFFERENTLY DOPED SUBSTRATE REGIONS BENEATH A COMMON ELECTRODE

This invention relates to charge coupled devices (CCD's) and, in particular, to the control of the propagation of charge in such devices.

There are many applications in which it is necessary differentially to control the flow of charge in a plurality of CCD channels. Some examples dealt with in this application are readout circuits for a CCD array. The array may be a CCD imager or a CCD memory and the readout is from this array to a plurality of output registers. In the case, for example, of a system which employs two output registers, the last row of the array is read out half into one of the registers and the other half, interleaved with the first half, into the other register and then the two output registers are concurrently shifted to obtain serial readout of both registers. An advantage of employing multiple output registers is that it permits closer spacing of the columns and this, in turn, permits higher storage capacity for a given substrate area in the case of a CCD memory and higher resolution in the case of a CCD imager.

The electrode structure of the present invention includes means responsive to a voltage applied to a single electrode for creating beneath that electrode, in a second substrate region, a relatively shallow potential well and in a third substrate region, a relatively deeper potential and in a first substrate region, between the second and third regions, a potential barrier. The use of this structure in various forms of readout systems for CCD arrays is discussed in detail below.

In the drawing.

In a number of the figures, similar reference numerals are applied to similar elements.

Figure 1:
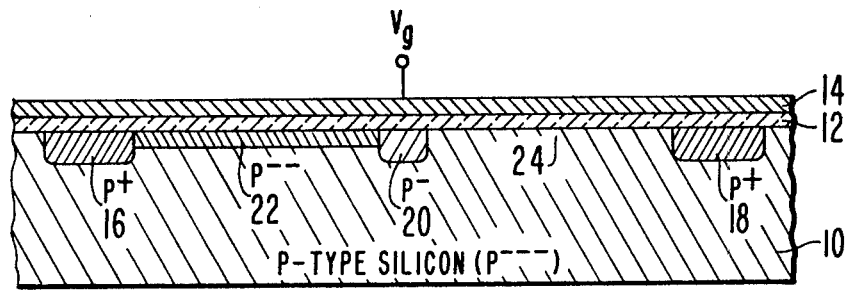
FIG. 1 is a cross-section showing one form of CCD structure embodying the invention.

Referring first to FIG. 1, the device shown includes a P-type substrate 10, an insulating layer 12, such as one formed of silicon dioxide, and a single electrode 14 which is uniformly spaced from the substrate by the insulating layer 12. The substrate is the least highly doped region and it is legended P— — —. The regions 16 and 18, which are doped P+, are the most highly doped regions and they operate as channel stops, that is, they provide potential barriers in the substrate. These regions and the others to be discussed, may be doped by ion implantation. The P— region 20 is not doped quite as heavily as the P+ regions and it provides a potential barrier which is slightly lower than the potential barriers produced by the channel stops. The P— — region 22 is doped somewhat more heavily than the substrate 10 and less heavily than the region 20 and it provides a shallower potential well in response to a given applied voltage than the potential well formed in the region 24 of P— — — type.

Figure 2:
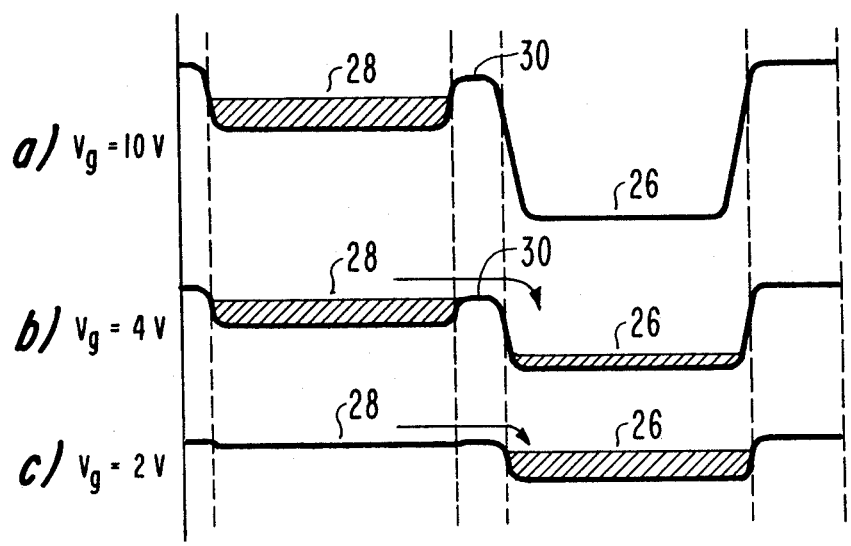
FIG. 2 is a drawing of surface potential profiles obtained during the operation of the CCD of FIG. 1.
Figure 3:
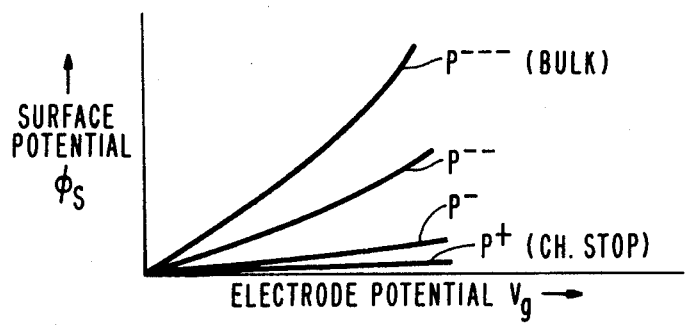
FIG. 3 is a graph of surface potential vs. electrode potential in the variously doped regions of the device of FIG. 1.

The operation of the device of FIG. 1 can be deduced from FIG. 3 which shows the surface potential $\phi_S$ produced in response to an applied electrode voltage $V_g$ in the three different regions. This operation is explicitly shown in the surface potential profiles of FIG. 2. In response to a voltage $V_g = 10$ volts, there is produced in the region 24, a relatively deep potential well 26, and in the region 22, a relatively shallow potential well 28, all as shown at a. Assume for purposes of this discussion that a certain amount of charge, as indicated by the hatching, is present in potential well 28. If the gate voltage $V_g$ is reduced to a value such as 4 volts as shown at b, the depth of potential well 28 is reduced sufficiently that some of the charge from well 28 flows over the barrier 30 created beneath the doped region 20, this charge flowing into potential well 26. Potential well 26 is not as deep as it was previously, but it still remains deeper than well 28.

As the voltage $V_g$ is decreased further, the potential well 28 becomes shallower and more of the charge flows into the potential well 26. Finally, a point is reached, at about 2 volts in the embodiment illustrated, at which substantially all of the charge 28 has been squeezed out of the well 28 and becomes stored in well 26, as shown at c. However, as can be seen, at this low value of voltage, the well 26 is fairly shallow so that to avoid loss of charge by injection into the substrate, the original amount of charge in well 28 can only be of restricted size. As an alternative, the area of the wells can be increased to handle larger amounts of charge with smaller potential changes.

As should be clear from the illustration, the device illustrated is a surface channel (P— substrate) device and the charge carriers are electrons. The inventive teachings, of course, are applicable also to N substrate (P channel) type devices where the charges are holes, and to buried channel devices, the latter being illustrated in FIG. 8, which is discussed later.

Figure 4:
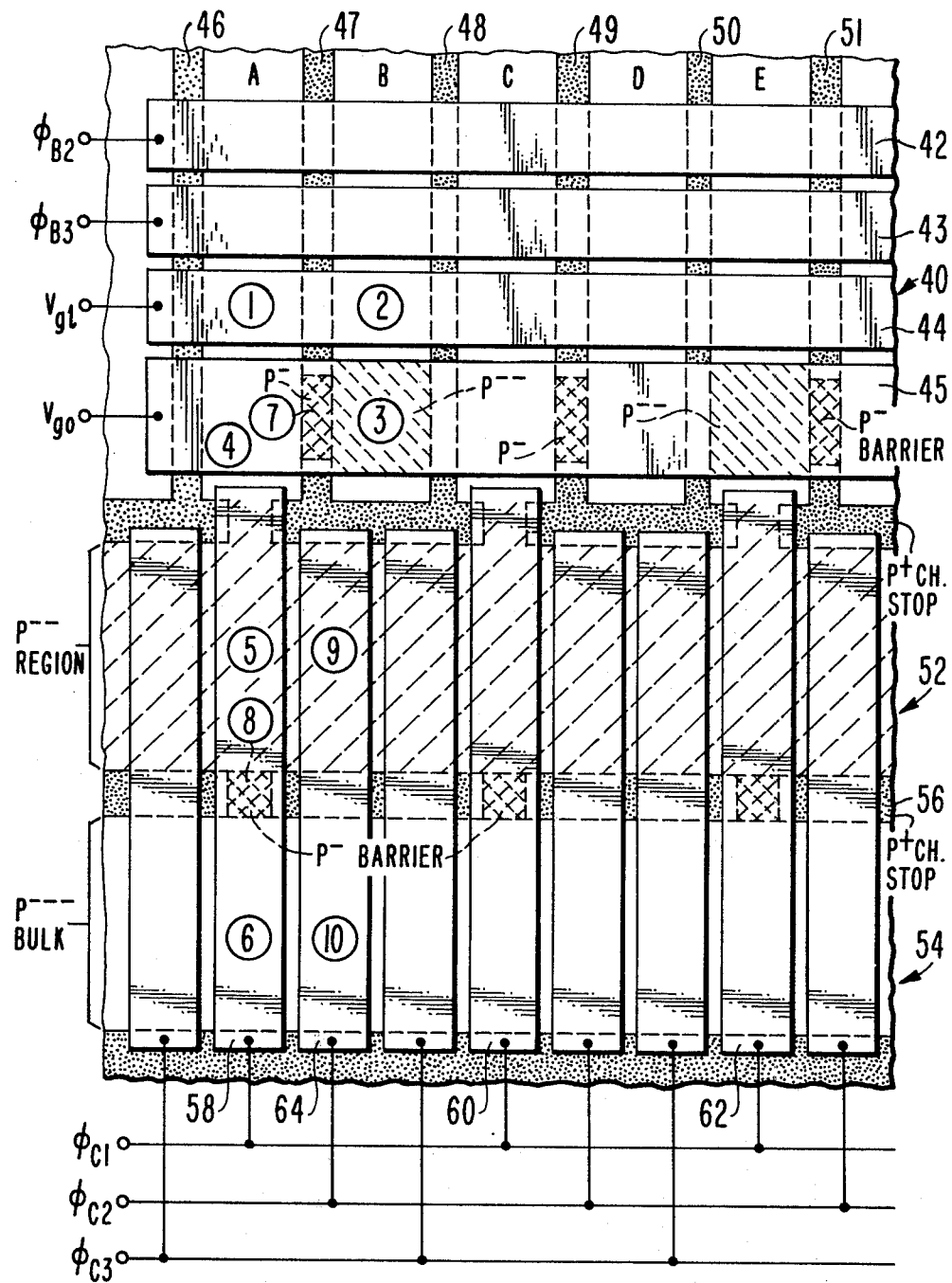
FIG. 4 is a plan view of a portion of a CCD array and two output registers for the array, both the array and output registers incorporating CCD structures embodying the invention.
Figure 5:
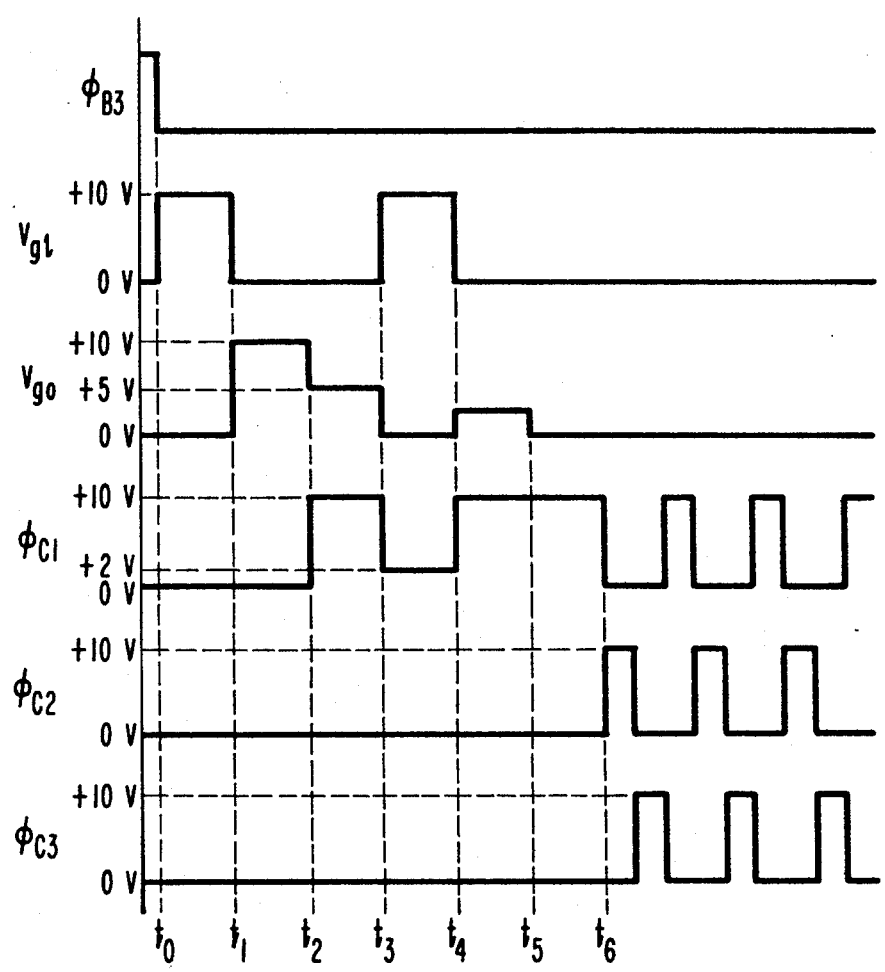
FIG. 5 is a drawing of waveforms employed during the operation of the system of FIG. 4.

FIG. 4 illustrates a system embodying the invention. The system includes a CCD array, a portion of which is illustrated at 40. This array may be a memory array or it may be an imager such as one of the field transfer type. Assuming the latter to be the case, 40 is the bottom portion of the B register. The electrode structure illustrated by way of example, is one of the single layer type where the electrodes such as 42-45, may be polysilicon regions of one conductivity type which are separated from one another by polysilicon regions of opposite conductivity type. The channels, A-E of which are illustrated, are separated from one another by channel stops 46-51.

Substrate regions to be discussed are illustrated by the numbers 1-10 which are circled. A typical CCD structure embodying the invention includes the regions 3 and 4. Region 3 is a P— — region corresponding to 22 of FIG. 1; region 4 is a P— — — region corresponding to 24 of FIG. 1; and the substrate region 7 between regions 3 and 4, is a P— barrier region corresponding to 20.

The system of FIG. 4 includes two output registers 52 and 54 which are separated from one another by channel stop 56. The register 52 is a lightly doped region, the P— — — region corresponding to 22 of FIG. 1, and the channel of register 54 comprises P— — — silicon corresponding to 24 of FIG. 1. The two output registers also have single layer structures such as already described and every third electrode has a structure such as shown in FIG. 1. Thus, electrode 58 includes a substrate region 5 corresponding to 22, a substrate region 6 corresponding to 24, and a barrier region 8 corresponding to region 20 of FIG. 1.

Figure 6A:
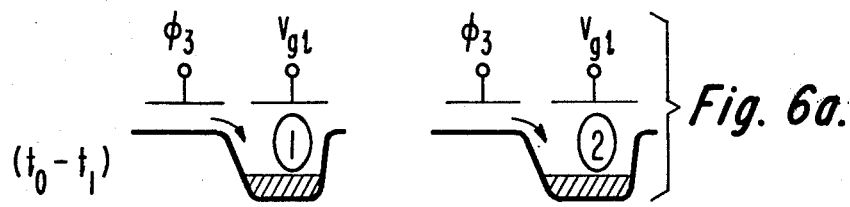
FIGS 6a-6e are drawings of surface potential profiles to help explain the operation of the system of FIG. 4.
Figure 6B:
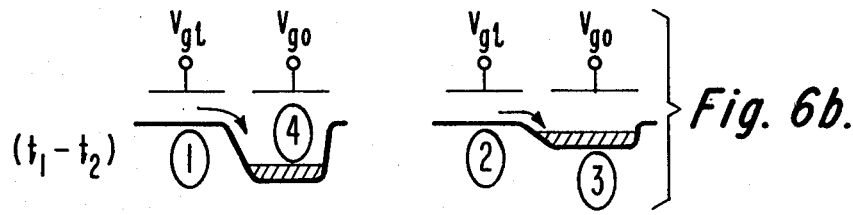

The operation of the system of FIG. 4 is illustrated in FIGS. 5 and 6a–6e. Only columns A and B, which are representative, are discussed. The system is a three-phase system and the phases $\phi_{B2}$ and $\phi_{B3}$ are applied to the two electrodes 42 and 43. Assuming to start with that $\phi_{B3}$ is high and $\phi_{B1}$ (not shown) and $\phi_{B2}$ are low, charges may be assumed to be present in the various columns beneath the $\phi_{B3}$ electrode 43. At time $t_0$, $\phi_{B3}$ goes low and $V_{gl}$ goes high. Charge in column A transfers into substrate region 1 and in column B transfers into substrate region 2 as illustrated in FIG. 6a.

At time $t_1$, $V_{gl}$ goes low to zero volts and $V_{go}$ goes high to +10 volts. In column A charge transfers from substrate region 1 to the relatively deep well in substrate region 4; in column B charge transfers from substrate region 2 to the relatively shallow potential well in substrate region 3. The barrier in region 7, which is located between regions 3 and 4, isolates the charges in these two regions.

Figure 6C:
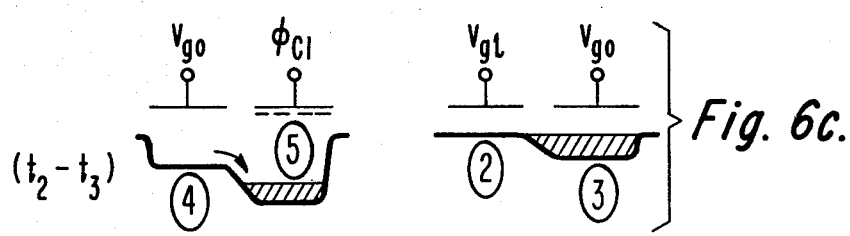

At time $t_2$, $V_{go}$ goes from +10 to +5 volts and $\phi_{C1}$ goes from 0 to +10 volts. In column A charge flows from the relatively shallow well in region 4 to the relatively deeper well in the region 5 beneath electrode 58 as shown in FIG. 6c. In channel B the potential well in region 3 becomes shallower; however, it is not so shallow that any of the charge can flow over the barrier 7.

Figure 6D:
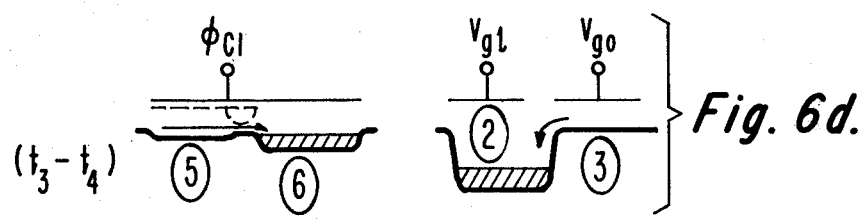

At time $t_3$, $V_{gl}$ goes high again to +10 volts, $V_{go}$ goes low to 0 volts and $\phi_{C1}$ goes low to roughly 2 volts. In column A the charge present in the P— — — region 5 flows over the barrier 8 and into the substrate region 6, all of this occurring beneath electrode 58. In channel B, when $V_{gl}$ goes high, a relatively deep potential well forms in substrate region 2 and correspondingly, the potential well in substrate region 3 beneath electrode 45 becomes shallower. The charge present in substrate region 3 flows back to the potential well in substrate region 2 beneath electrode 44 in preference to flowing over the barrier in region 7 beneath electrode 45. All of this is shown in FIG. 6d.

Figure 6E:
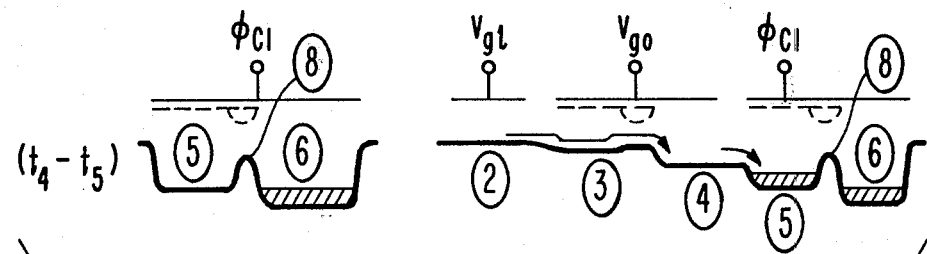

At time $t_4$, $V_{gl}$ goes low, $V_{go}$ goes high to about 2 volts and $\phi_{C1}$ goes high to about 10 volts. This results in the flow of charges as depicted in FIG. 6e. In column A, the potential well in region 5 gets deeper and the potential well in region 6 gets deeper. The charge formerly propagated to region 6 remains in region 6 undisturbed. In channel B when $V_{gl}$ returns to 0 volts, the charge formerly present in region 2 flows away from that region. $V_{go}$ is at +2 volts so that region 3 has a relatively shallow well therein but one which is deeper than the well in region 2. Region 4 has a deeper potential well than region 3. Moreover, the potential barrier in region 7 is at this point, that is, in response to the voltage $V_{go}$=2 volts, at approximately the same surface potential as region 3, as was previously illustrated at c in FIG. 2. Finally, region 5 has a relatively deeper potential well therein than that present in region 4. Accordingly, charge flows from region 2 through regions 3 and 4 to region 5. The potential barrier at 8 prevents the charge in region 5 from passing into region 6.

Summarizing what has occurred to this point, the charge in channel A has passed to output register 54 and is located in a potential well beneath electrode 58. The charge in channel B has passed from channel B over the barrier in region 7 and into channel A and from channel A, has passed to output register 52 in substrate region 5 beneath electrode 58.

After the operation described above, the three-phase output voltages $\phi_{C2}-\phi_{C3}$ go on and the charges present in regions 5 and 6 and the corresponding charges beneath electrodes 60, 62 and so on, all propagate to the right to the output circuit (not shown) of the output registers. For example, at time $t_6$, $\phi_{C1}$ goes low and $\phi_{C2}$ goes high and the charges in regions 5 and 6 propagate to the substrate regions 9 and 10 beneath the $\phi_{C2}$ electrode 64. The remainder of the operation is believed to be self-evident from what has already been discussed and requires no further explanation.

Figure 7:
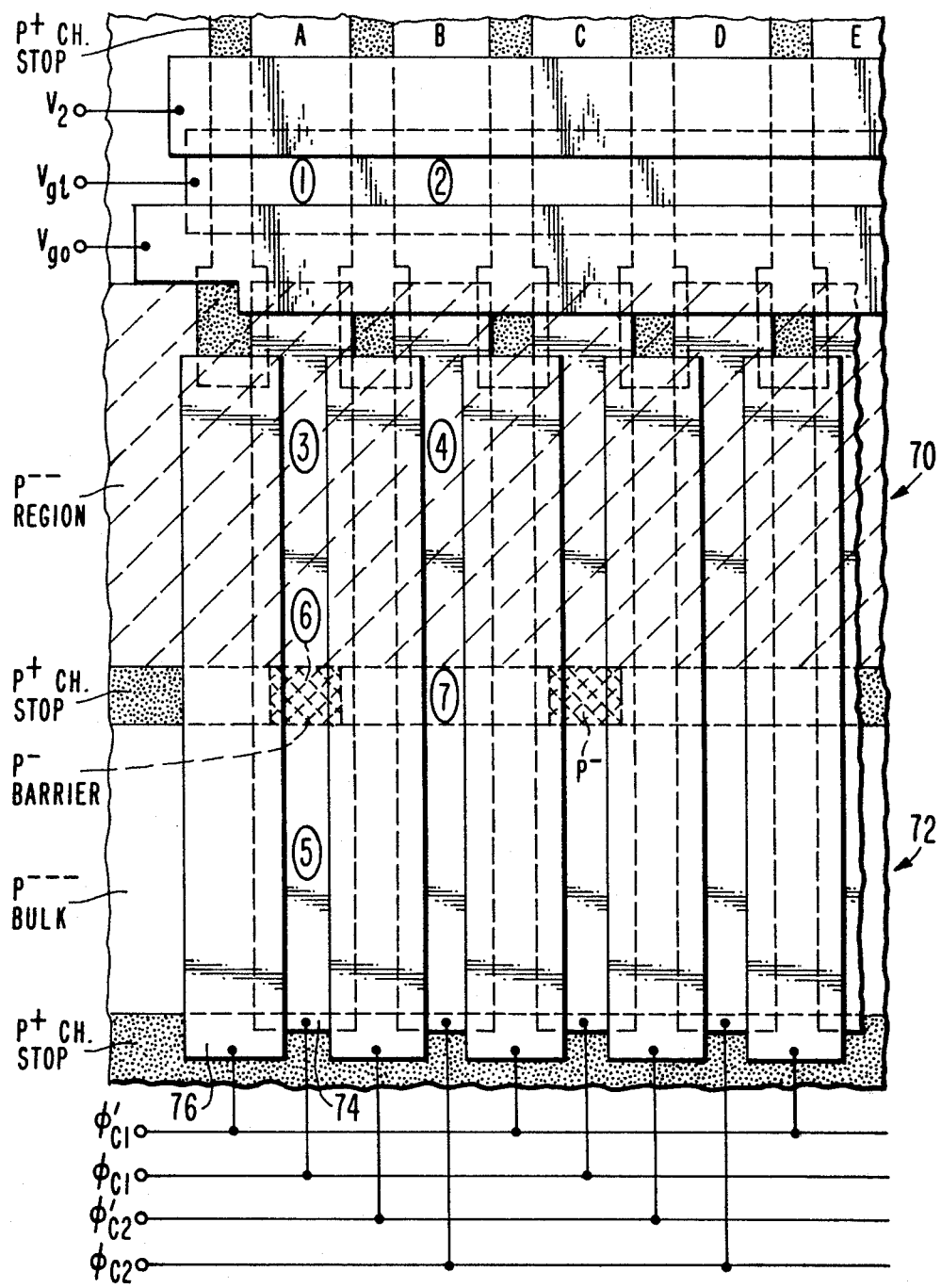
FIG. 7 is a plan view of another form of CCD array and output registers therefor which output registers embody the invention.

The embodiment of the invention illustrated in FIG. 7 comprises a two-phase system which employs a two-level overlapped gate electrode structure. A preferred form of the invention uses all polysilicon gates; however, alternatives are possible. In the embodiment of FIG. 7, the CCD structure embodied in the present invention is employed only in the output registers.

In the operation of the system, charge propagates in channel A from substrate region 1 to substrate region 3 of output register 70 in response to the applied voltages $V_2$, $V_{gl}$, $V_{go}$ and $\phi_{C1}$. During this phase of the operation, $\phi_{C2}$ goes high to +10 volts concurrently with $\phi_{C1}$ so that charge in channel B propagates from substrate region 2 to substrate region 4 at the same time that charge in channel A propagates to region 3. Subsequently, by lowering the $\phi_{C1}$ voltage, while $V_{go}$, $\phi'_{C1}$ and $\phi'_{C2}$ are all low at 0 volts, and while $\phi_{C2}$ remains high at +10 volts, the charge in substrate region 3 passes over the barrier in substrate region 6, which barrier is at approximately the same surface potential in response to the lowered $\phi_{C1}$ voltage as the substrate region 3, and this charge passes into the deeper potential well in substrate region 5. For channel B there is a P+ channel stop region 7 between output register 70 and output register 72. This prevents the charge in register 70 from passing into register 72 after it reaches region 4.

Upon the completion of the process described above, output registers 70 and 72 are both full. However, the charges in register 70 are located beneath the $\phi_{C2}$ electrodes whereas the charges in register 72 are located beneath the $\phi_{C1}$ electrodes. These charges may be propagated to the right in response to the two-phase voltages illustrated. To achieve such charge propagation, $\phi_{C1}$ is placed in phase with $\phi'_{C1}$ but made of higher amplitude than $\phi'_{C1}$ so that deeper potential wells form beneath storage electrodes such as 74, than beneath transfer electrodes such as 76. The $\phi_{C2}$ voltage is made 180° out of phase with the $\phi_{C1}$ voltage and is placed in phase with the $\phi'_{C2}$ voltage but made of higher amplitude than the $\phi'_{C2}$ voltage, again to produce deeper potential wells beneath the $\phi_{C2}$ storage electrodes than beneath the $\phi'_{C2}$ transfer electrodes.

To start the charge propagation, the $\phi'_{C2}$ voltage may be made high ($\phi_{C2}$ is already high), and the $\phi_{C1}$ and $\phi'_{C1}$ voltages made sufficiently low to propagate the register 72 charges from beneath the $\phi_{C1}$ storage electrodes to beneath the $\phi_{C2}$ storage electrodes while the register 70 charges remain beneath the $\phi_{C2}$ storage electrodes. Thereafter, by continuing the application of the alternating two-phase $\phi_C$ voltages, the charges will step along, in synchronism and in alignment. If desired, register 72 may be made one half stage longer than register 70 so that charges from alternate columns A, C, E and so on will reach the output (not shown) one half the period of a $\phi_C$ clock voltage after the charges in register 72 (which are derived from columns B, D, F and so on).

Figure 8:
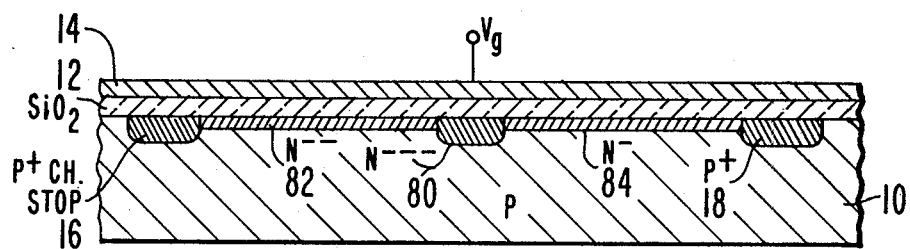
FIG. 8 is a section through another form of device embodying the invention.

FIG. 8 illustrates a buried channel device which operates on the same principles as the surface channel device already discussed. It includes a P-type substrate 10, a silicon dioxide layer 12 and a single electrode 14 which is uniformly spaced from the substrate surface. The channel stops 16 and 18 are formed of more highly doped P-type silicon than the substrate. A lightly doped N-type region 80, legended N———, is centered between the two channel stops and provides a potential barrier. A more heavily doped N-type region 82, legended N——, is provided at the surface of the substrate between channel stop 16 and barrier region 80. The most heavily doped N-type region 84, legended N—, is at the surface of the substrate between channel stop 18 and barrier region 80.

Figure 9:
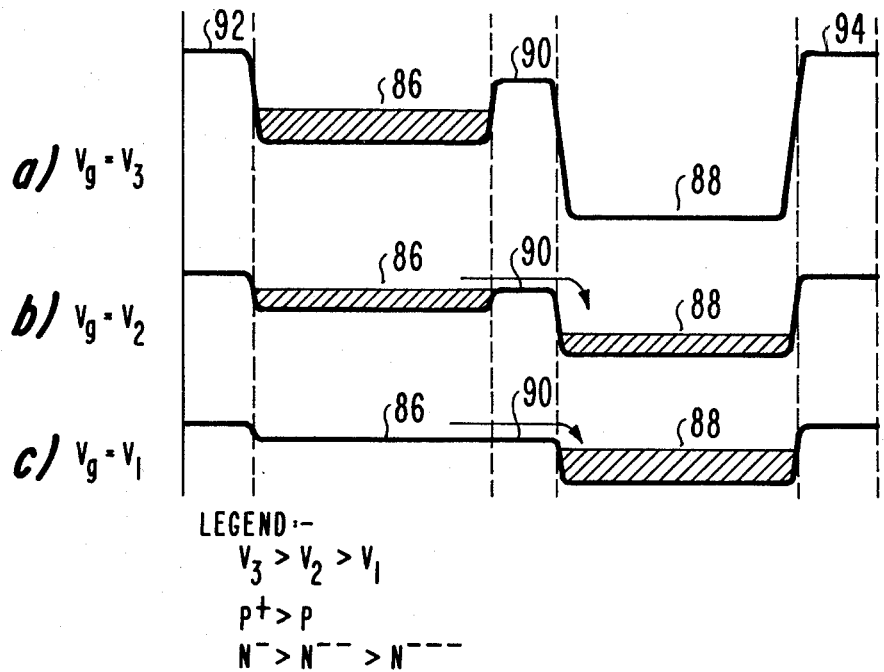
FIG. 9 is a drawing of surface potential profiles obtained during the operation of the device of FIG. 8.
Figure 10:
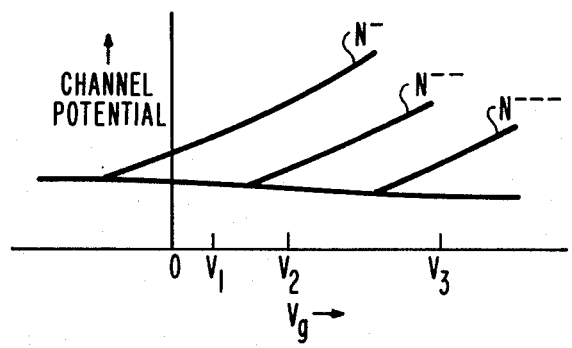
FIG. 10 is a graph of channel potential vs. gate potential for various regions of the device of FIG. 8.

The operation of the device of FIG. 8 may be implied from the graph of FIG. 10 and this operation is shown in FIG. 9. At a given gate electrode potential $V_g$, as the N-type doping level increases, the channel potential also increases. Thus, at the gate electrode voltage $V_2$, the channel potential at the N—— region is lower than in the more heavily doped N— region as is clear from FIG. 10. Referring to FIG. 9, at a gate voltage $V_g = V_3$, the potential well 86 in region 82 is shallower than the potential well 88 in region 84. This is shown at a in FIG. 9 which also shows charge present in potential well 86. When the gate voltage $V_g$ is reduced to a lower value such as $V_2$, the well 86 becomes shallower and some of the charge flows over the potential barrier 90 into well 88. As in the previous embodiment, the barrier 90 is at a lower level than the potential barriers 92 and 94 provided by the channel stops. When the voltage $V_g$ is reduced still further to the value $V_1$, all of the charge formerly present in well 86 has been squeezed out of this well and has been propagated to the deeper well 88.

The operating principles discussed above are the same as those given in connection with FIG. 2. However, in the embodiment of FIG. 9, the charge carriers are majority carriers with respect to the N-type surface layers and will propagate in a potential minimum within the N-type region as is well understood in this art.

While no specific system is illustrated for the embodiments of FIG. 8, it should be clear to the reader that it may be employed in a buried channel version of a system such as shown in FIG. 4, or such as shown in FIG. 7, as two examples.

Figure 11:
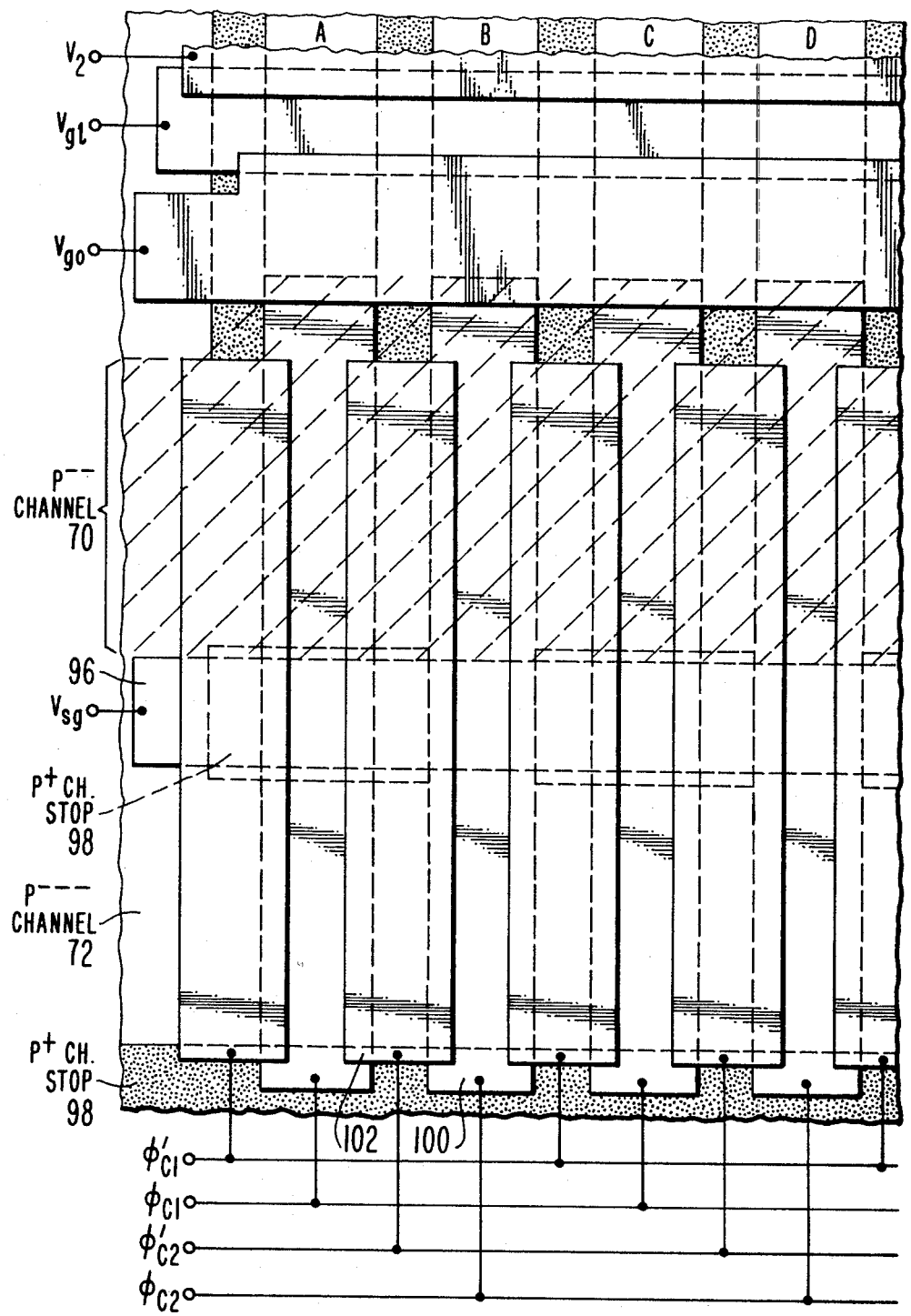
FIG. 11 is a plan view of an array and output registers therefor, the output registers embodying another form of CCD structure.

FIG. 11 illustrates an earlier version of an electrode structure than what has already been described. In the system of FIG. 11, the means providing the potential barrier between two wells comprises a gate electrode 96 rather than an implanted region such as 80 or 20. In response to a voltage $V_{sg}$, this gate electrode provides a potential barrier between, for example, a P—— channel and a P——— channel, where the doping levels are as illustrated in FIGS. 1 and 3. The potential barrier can be controlled in response to the voltage $V_{sg}$ in a manner analogous to that illustrated in FIG. 2.

The operation of the system of FIG. 11 is analogous to that of FIG. 7. Charge from a channel such as A ends up in the upper output register, that is, in channel 70. The P+ channel stop 98 prevents this charge from passing to the lower output register, that is, channel 72. Charge from a channel such as B passes through the more heavily doped channel 70 region beneath electrode 100 to the less heavily doped channel region 72 beneath electrode 100 under the control of the gate electrode potential $\phi_{C2}$ and the barrier potential $V_{sg}$. The operation in other respects is analogous to that of FIG. 7.

While the structure of FIG. 11 is simpler than some other earlier versions of double channel output registers, it is considerably more complex than that of the other embodiments discussed. The version of FIG. 11 employs a three-level electrode construction as, for example, three levels of polysilicon. The gate electrode 96 is at the lower-most, that is, the first level. The storage electrodes such as 100, are at a second level and the transfer electrodes such as 102, are at a third level.

What is claimed is:

1. A charge-coupled device (CCD) comprising:
   a semiconductor substrate;
   an electrode insulated from the substrate and substantially uniformly spaced from the substrate, said electrode having opposite edges;
   two channel stops in the substrate beneath said electrode for creating potential barriers in said substrate, said channel stops being spaced from one another and extending to said opposite edges of said electrode;
   a first substrate region between the two channel stops, spaced from one of the channel stops by a second substrate region and from the other of the channel stops by a third substrate region, said second substrate region having a sufficiently different impurity concentration than said third substrate region that a shallower potential well forms in said second than in said third region in response to a voltage applied to said electrode, and said first substrate region having an impurity concentration such that a potential barrier is present between said wells over a range of voltages applied to said electrode, which barrier is lower than the channel stop potential barrier, but which is such that when said voltage is lowered to a value beyond said range, the substrate potential of said second region becomes substantially equal to that of said first region and any charge carriers present in said second region flow into said third region.

2. A CCD as set forth in claim 1, wherein said CCD comprises a surface channel CCD, said first, second and third regions being of the same conductivity type and of successively lower impurity concentrations.

3. A CCD as set forth in claim 1, wherein said CCD comprises a buried channel CCD, the bulk of said substrate being of one conductivity type, and said first, second and third regions being of opposite conductivity type and being of successively higher impurity concentrations.

4. A charge-coupled device (CCD) comprising:
   a semiconductor substrate;
   a first and second substantially parallel channels in said substrate, extending in a given direction, each channel comprising a substrate region and means creating potential barriers which define the opposite edges of each channel;

a plurality of electrodes common to said channels extending in a direction which is generally transverse to said given direction, said electrodes being insulated from the channels and being responsive to applied potentials for producing potential wells in the channels for the storage in and propagation of charge along the respective channels, said electrodes including first and second adjacent electrodes, arranged in that order;

a potential barrier first region in said substrate beneath the second of said electrodes, which barrier defines the boundary between said first and second channels, said first region having an impurity concentration such that the potential barrier created is lower than the potential barrier defining the channel edges;

a second region in said first channel beneath said second electrode, said second region comprising a normal channel region;

a third region beneath said second electrode, in said second channel, said third region having an impurity concentration such that the potential well which forms in said third region in response to a voltage applied to said second electrode is lower than that which forms in said second region;

an output electrode following the second electrode in said first channel and over a fourth substrate region;

fifth and sixth regions beneath said first electrode, in said first and second channels, respectively, each comprising a normal substrate region;

means for applying voltages to said first, second and output electrodes, during one group of sequential time periods, of values for shifting one charge packet, when present in said fifth region into said second region and then to said fourth substrate region and for concurrently shifting another charge packet, when present in said second channel, from said sixth to said third region and trapping the same in said third region, and for then applying multiple-phase voltages to said first, second and output electrodes, during a second group of sequential time periods, of values for shifting said another charge packet out of said third region back to said sixth region, then from said sixth to said third region, then over said barrier in said first region through said second region to said fourth region.

* * * * *